US011469185B2

(12) United States Patent
Chang et al.

(10) Patent No.: US 11,469,185 B2
(45) Date of Patent: Oct. 11, 2022

(54) STANDOFF MEMBERS FOR SEMICONDUCTOR PACKAGE

(71) Applicant: Intel Corporation, Santa Clara, CA (US)

(72) Inventors: Je-Young Chang, Tempe, AZ (US); Shubhada H. Sahasrabudhe, Gilbert, AZ (US); Tannaz Harirchian, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 408 days.

(21) Appl. No.: 16/465,907

(22) PCT Filed: Nov. 27, 2017

(86) PCT No.: PCT/US2017/063328
§ 371 (c)(1),
(2) Date: May 31, 2019

(87) PCT Pub. No.: WO2018/125452
PCT Pub. Date: Jul. 5, 2018

(65) Prior Publication Data
US 2020/0066654 A1    Feb. 27, 2020

Related U.S. Application Data

(63) Continuation of application No. 15/396,108, filed on Dec. 30, 2016, now abandoned.

(51) Int. Cl.
*H01L 23/00*    (2006.01)
*H01L 21/48*    (2006.01)
(Continued)

(52) U.S. Cl.
CPC .......... *H01L 23/562* (2013.01); *H01L 21/481* (2013.01); *H01L 23/04* (2013.01);
(Continued)

(58) Field of Classification Search
None
See application file for complete search history.

(56) References Cited

U.S. PATENT DOCUMENTS 5,786,635 A  *  7/1998  Alcoe .................. H01L 21/563
                                                    257/E23.09
6,058,015 A       5/2000  Sammakia et al.
(Continued)

FOREIGN PATENT DOCUMENTS

KR    20090088956 A    8/2009
WO    WO-2015049849 A1 *  4/2015  ......... H01L 23/4006

OTHER PUBLICATIONS

International Search Report and Written Opinion for PCT Application No. PCT/US2017/063328, dated Mar. 5, 2018, 15 pages.

*Primary Examiner* — Erik Kielin
(74) *Attorney, Agent, or Firm* — Eversheds Sutherland (US) LLP (57) ABSTRACT

Semiconductor packages having support members are provided. Support members can mitigate damage to a semiconductor die mounted on a semiconductor package. In some embodiments, an arrangement of support packages can be formed at respective locations of a frame layer that serves as a stiffener for the semiconductor package. Each support member in the arrangement can be formed from a same material of the frame layer or a different material. In some embodiments, a support member can be mounted or otherwise coupled to an exposed surface of the frame layer. In addition or in other embodiments, a support member can be mounted on a surface that supports the semiconductor die. The arrangement of support members can include support members comprising a first material and/or other support members formed from respective materials. A support mem-
(Continued)

ber can be formed from a metal, a metal alloy, a semiconductor, a polymer, a composite material, or a porous material.

25 Claims, 6 Drawing Sheets

(51) Int. Cl.
| | |
|---|---|
| *H01L 23/16* | (2006.01) |
| *H01L 23/04* | (2006.01) |
| *H01L 25/065* | (2006.01) |
| *H01L 23/42* | (2006.01) |
| *H01L 23/10* | (2006.01) |
| *H01L 23/40* | (2006.01) |
| *H01L 23/498* | (2006.01) |
| *H01L 23/367* | (2006.01) |
| *H01L 23/427* | (2006.01) |

(52) U.S. Cl.
CPC .............. *H01L 23/10* (2013.01); *H01L 23/16* (2013.01); *H01L 23/4006* (2013.01); *H01L 23/42* (2013.01); *H01L 25/0655* (2013.01); *H01L 23/3675* (2013.01); *H01L 23/427* (2013.01); *H01L 23/49816* (2013.01); *H01L 23/49822* (2013.01); *H01L 2224/16227* (2013.01); *H01L 2224/73253* (2013.01); *H01L 2924/15311* (2013.01); *H01L 2924/3511* (2013.01)

(56) References Cited

U.S. PATENT DOCUMENTS

| | | | | |
|---|---|---|---|---|
| 6,118,117 | A * | 9/2000 | Ducellier | H01S 5/50 |
| | | | | 250/214 R |
| 6,166,435 | A * | 12/2000 | Leu | H01L 23/3675 |
| | | | | 257/E23.106 |
| 6,667,557 | B2 * | 12/2003 | Alcoe | H01L 21/563 |
| | | | | 174/541 |
| 2002/0031628 | A1 * | 3/2002 | Zumbrum | B32B 5/32 |
| | | | | 428/36.9 |
| 2003/0146503 | A1 | 8/2003 | Khan et al. | |
| 2004/0195701 | A1 | 10/2004 | Attarwala | |
| 2009/0134530 | A1 * | 5/2009 | Kurihara | H05K 1/0271 |
| | | | | 257/784 |
| 2012/0018871 | A1 | 1/2012 | Lee et al. | |
| 2012/0098118 | A1 * | 4/2012 | Lin | H01L 21/563 |
| | | | | 257/713 |
| 2014/0252634 | A1 * | 9/2014 | Hung | H01L 23/48 |
| | | | | 257/773 |
| 2015/0187679 | A1 * | 7/2015 | Ho | H01L 23/367 |
| | | | | 257/690 |
| 2018/0151461 | A1 * | 5/2018 | Cho | H01L 23/562 |

\* cited by examiner

STANDOFF MEMBERS FOR SEMICONDUCTOR PACKAGE

CROSS-REFERENCE TO RELATED APPLICATION(S)

This application is a U.S. National Stage Application under 35 U.S.C. 371, which claims the priority benefit of PCT International Application No. PCT/US2017/063328, filed Nov. 27, 2017, in which this application claims the benefit of U.S. Non-Provisional application Ser. No. 15/396,108, filed Dec. 30, 2016, the disclosures of which are incorporated herein by reference as if set forth in full.

BACKGROUND

Reliance on thinner bare-die ball-grid-array (BGA) semiconductor packages can reduce form factor (e.g., overall product stack height) and/or can improve electrical performance of products that incorporate such semiconductor packages. The products can include numerous types of computing devices, such as mobile device, portable devices, wearable devices, and the like. The utilization of such semiconductor packages, however, can add complexity to the implementation of other systems that also are included in those products. Particularly, the handling, such as the assembly, maintenance, and/or repair, of thermal systems usually deployed in a product can be complicated due to unintended mechanical interactions between components of a thermal system and another component in the component stack of a bare-die BGA semiconductor package within the product. The handling typically entails manual processes that can exacerbate unintended mechanical interactions. Therefore, much remains to be improved in the design of mechanically resilient semiconductor packages.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

DETAILED DESCRIPTION

The disclosure recognizes and addresses, in at least some embodiments, the issue of potential damage of a semiconductor die in a bare-die semiconductor package during the assembly or other types of manipulation of a thermal solution coupled to the bare-die semiconductor package. In a manufacturing process of a computing device (portable, mobile, wearable, or otherwise), thermal solution assembly may include a manual process. As such, human intervention can lead to unintended and/or poorly controlled interaction with a component of bare-die semiconductor package. That type of interaction can cause an undesired deflection or tilt of a cold plate, for example, and ensuing mechanical contact with a portion (e.g., a corner and/or an edge) of a semiconductor die or with a passive component included in a semiconductor package. Such mechanical contact can cause damage (e.g., die cracks, electrical shorts, and the like) and/or can result in product performance degradation due to inadequate thermal solution performance. Accordingly, embodiments of the disclosure can include semiconductor packages having standoff members or other types of support members that can support a load associated with the assembly and/or manipulation of a component of a thermal solution or another type of solution that supplements the performance of a product including the semiconductor packages. In some embodiments, the load can be embodied in or can include, for example, an elastic force exerted by a flexible member (such as spring plate, a flexible clamp, or the like) included in the thermal solution. Therefore, at least one of the standoff members (or another type of support members) of a semiconductor package can restrict the movement of the component (e.g., a cold plate) during the assembly and/or manipulation of the thermal solution.

As described in greater detail below and the associated drawings, standoff members included in a semiconductor package can mitigate mechanical damage to a semiconductor die mounted on a semiconductor package. In some embodiments, an arrangement of support packages can be formed at respective locations of a frame layer that serves as a stiffener for the semiconductor package. Thus, each support member in the arrangement can be formed from a material that forms the frame layer. In some embodiments, a support member can be mounted or otherwise coupled to an exposed surface of the frame layer. In addition or in other embodiments, a support member can be mounted on a surface that supports the semiconductor die. The arrangement of support members can include support members comprising a first material and/or other support members formed from respective materials. A support member can be formed from a metal, a metal alloy, a semiconductor, a polymer, a composite material, or a porous material (e.g., a porous semiconductor, a foam material, a sponge material, or the like). Semiconductor packages in accordance with one or more embodiments of this disclosure can be utilized in bare-die products and/or other types of products including semiconductor dies integrated into or coupled with other solutions within a device.

Figure 1:
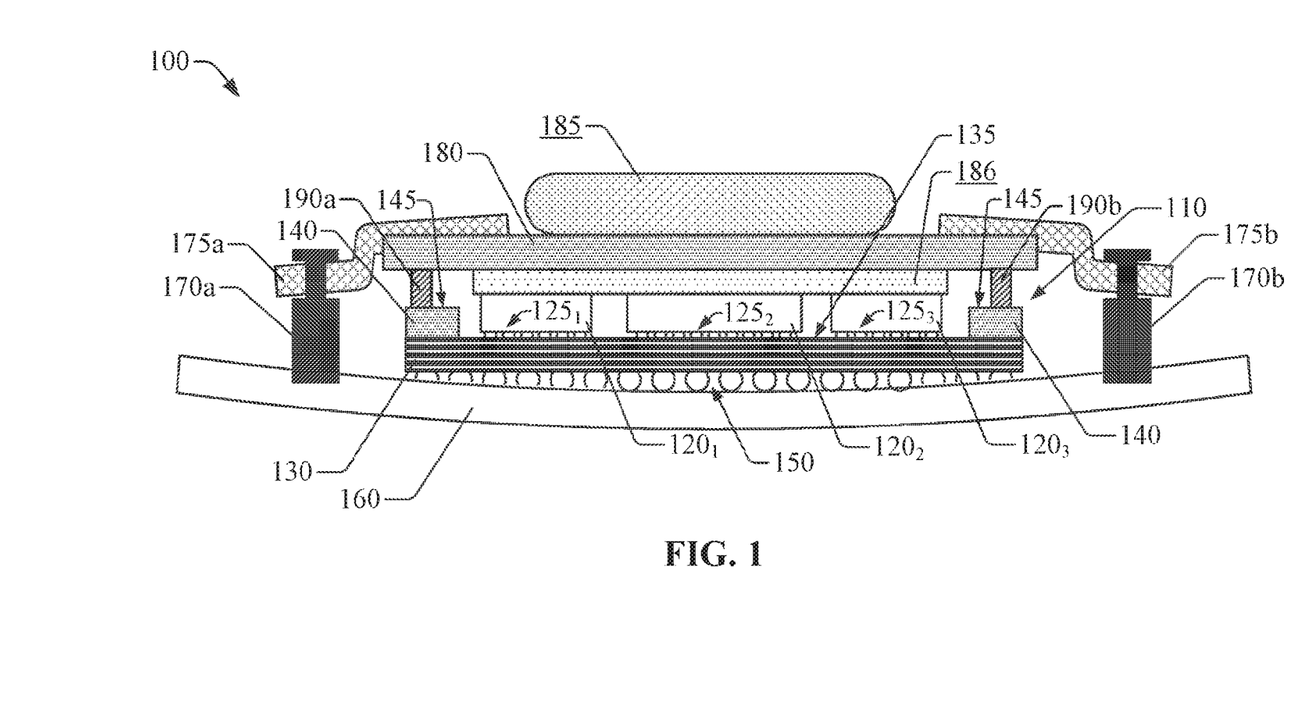
FIG. 1 illustrates an example of a system including a semiconductor package in accordance with one or more embodiments of the disclosure.

With reference to the drawings, FIG. 1 illustrates an example of a system 100 that includes a semiconductor package 110 integrated into a thermal solution, in accordance with one or more embodiments of disclosure. The semiconductor package 110 includes a group of semiconductor dies, including a first semiconductor die $120_1$, a second semiconductor die $120_2$, and a third semiconductor die $120_3$, each surface mounted to a package substrate 130. Numerous types of interconnects can permit surface mounting each semiconductor die of the group of semiconductor dies to a first substrate layer 135 of the package substrate 130. In some aspects, such interconnects can mechanically and/or electrically couple a semiconductor die of the group of semiconductor dies to the package substrate 130 at conductive pads (e.g., metal pads or metallic pads) placed on the first substrate layer 135 of the package substrate 130. In some embodiments, such interconnects can be embodied in or can include a ball grid array, such as a flip-chip BGA (FC-BGA). Thus, as illustrated, a first BGA $125_1$, a second BGA $125_2$, and a third BGA $125_3$ can permit or otherwise facilitate coupling a respective one of the first semiconductor die $120_1$, the second semiconductor die $120_2$, and the third semiconductor die $120_3$ to a respective surface of the first substrate layer 135. Each (or, in some embodiments, at least one) of the multiple semiconductor dies can include circuitry that can provide, at least in part, one or more functionalities (e.g., computing, navigation, sensing, a combination thereof, or the like). More specifically, the circuitry can embody or can include microprocessors, microcontrollers, application specific integrated circuits (ASICs), gate arrays, memory devices, digital signal processors (DSPs), programmable logic devices (PLDs), graphics chipsets and/or PC chipsets, a combination of the foregoing, or the like. In some embodiments, the semiconductor package 110 also can include a microelectromechanical system (MEMS)—such as a movable diaphragm and a backplate in a microphone, a gyroscope or another type of solid-state accelerometer, and the like that also can permit or otherwise facilitate, at least in part, at least one of the one or more functionalities.

The package substrate 130 can be embodied in or can include a slab (not depicted) on which multiple semiconductor packages can be fabricated concurrently or nearly concurrently. In some embodiments, the slab can have a rectangular cross-section (in the shape of a rectangle or a square) having a side length in a range from about 5 mm to about 100 mm. Further, as mentioned, the package substrate 130 can include pads for wire bonding provided thereon or another type of interconnect attachment that requires an electrical contact. The package substrate 130 can be fabricated of any rigid or flexible solid material, such as a plastic; a ceramic; composite materials (e.g., metal-ceramic composites, metal-plastic composite, or the like); glass; epoxy laminates of fiberglass sheets; FR-4 materials; FR-5 materials; combinations thereof, or the like. In some embodiments, the package substrate 130 can include a core and interconnect build-up layers on either side of the core. In other embodiments, the package substrate 130 can be embodied in or can include a coreless slab including multiple interconnect build-up layers. The core and/or the interconnect build-up layers also can be formed from one or a combination of the foregoing materials. In some embodiments, such layers may not be fabricated from a same material as the material utilized to fabricate the core of the package substrate 130. For instance, the package substrate 130 can be embodied in an ultra-thin core (UTC) substrate and, therefore, the package substrate 130 can include a core layer, first interconnect layers, and second interconnect layers. The core layer can be embodied in or can include a dielectric layer having a substantially uniform thickness in a range from about 10 μm to about 100 μm. The first interconnect layers can be disposed on a first side of the core layer, adjacent thereto. The second interconnect layers can be disposed on a second side of the core layer, opposite the first side. In one example, the first interconnect layers and the second interconnect layers can be referred to as front interconnect layers and bottom interconnect layers, respectively. In some embodiments, the first interconnect layers include one or more first metal layers, one or more first dielectric layers, and a first solder resist (SR) layer. In addition, the second interconnect layers can include one or more second metal layers, one or more second dielectric layers, and a second SR layer. The first SR layer and the second SR layer can correspond to respective outermost substrate layers of the package substrate 130. In some embodiments, the first SR layer embodies or includes the first substrate layer 135.

In addition, a frame layer 140 can be coupled to the package substrate 130, forming an interface with the first substrate layer 135. The frame layer 140 can include an inner perimeter and an outer perimeter. Thus, the frame layer 140 is depicted in FIG. 1 as two elements having a common numeral. In some aspects, the frame layer 140 that can provide rigidity to or can improve the rigidity of the package substrate 130. As such, the frame layer 140 can embody or can constitute a stiffener member of the semiconductor package 110. Therefore, the frame layer 140 can include a rigid material that can permit or otherwise facilitate mitigating or avoiding warpage of the package substrate 130. To that end, in some embodiments, the rigid material can include, for example, a metal, a metallic alloy, a semiconductor, a ceramic material, a hard polymer, a combination thereof, or the like. In some examples, the metal can include copper, aluminum, tungsten, silver, gold, palladium, platinum, zinc, nickel, or the like, and the metallic alloy can include a solid having a phase of two or more of the foregoing metals. In other examples, the semiconductor can include Si, Ge, an alloy of Si and Ge, a III-V semiconductor, a II-VI semiconductor, and the like. As a further example, the ceramic material can include a dielectric material. In some aspects, elastic constants of the rigid material can have respective magnitudes that can be greater than the magnitudes of corresponding elastic constants of a material that constitutes the package substrate 130.

The semiconductor package 110 also includes interconnects 150 that can couple (mechanically and/or electrically) the package substrate 130 to a board substrate 160. More specifically, in some embodiments, the second SR layer included in the second interconnect layers within the package substrate 130 can support or can be coupled (e.g., soldered) to the interconnects 150, thus permitting or otherwise facilitating the coupling between the interconnect 150 and the board substrate 160. The board substrate 160 is not included in the semiconductor package 110 and can be embodied in or can include a printed circuit board (PCB), a motherboard, or the like, that constitutes a product, such as a computing device or another type of consumer electronics product.

As part of the integration of the semiconductor package 110 into the thermal solution illustrated in the system 100, the board substrate 160 can be mechanically coupled to first mechanical support members that can have affixed thereto respective second support members (e.g., a spring plate, a flexible clamp, or the like). The first mechanical support members can include multiple members (e.g., 2, 3, 4, and the like) and the second support members also can include multiple members (e.g., 2, 3, 4, etc.) in a number commensurate with the first mechanical support members. As such, the first support members can include a first support member 170a and a second support member 170b, and the second support members can include a first flexible member 175a and a second flexible member 175b. As illustrated in FIG. 1, the first support member 170a can be coupled to the first flexible plate 175a, and the second support member 170b can be coupled to the second flexible plate 175b. The first support members and the second support members can hold the board substrate 160 and the semiconductor package 110 coupled thereto to a cold plate 180. The cold plate 180 can be coupled (mechanically and/or thermally) to one or more heat pipes 185 or other types of heat sinks. The heat pipe(s) 185 can be coupled to a heat exchanger component (not depicted in FIG. 1) positioned remotely from the semiconductor package 110.

The coupling between the cold plate 180 and the first flexible plate 175a and the second flexible plate 175b can result in elastic forces being exerted on the cold plate. A thermal interface material (TIM) layer 186 can support the cold plate 180, providing a reaction force that balances the exerted elastic forces. The TIM layer 186 can include thermal grease, thermal glue, a thermal pad, thermal gap filler, and/or a thermal adhesive layer. In some instances, the elastic force can cause the TIM layer 186 to yield and, therefore, the cold plate 180 can move towards the multiple semiconductor dies included in the semiconductor package 110. As illustrated in FIG. 1, the semiconductor package 110 can include a group of standoff members, including a first standoff member 190a and a second standoff member 190b. Each standoff member of the group of standoff member can extend along a direction (referred to as a vertical direction) essentially perpendicular to the surface 135, from a first end at a surface 145 of the frame layer 140 to a distal second end opposite to the first end. Accordingly, a side of the standoff member can have a defined length h (a real number in units of distance; h may be referred to as a height) along the vertical direction. The group of standoff members is not limited to including two or more members and, in some embodiments, a single standoff member can be constitute the group of standoff members. In some aspects, the group of standoff members can be utilized or otherwise leveraged to prevent damage of one or more of the semiconductor dies of the semiconductor package 110 during assembly and/or disassembly of a thermal solution and/or other types of manipulation of the system 100 or a portion thereof. Thus, each (or, in some embodiments, at least one) standoff member of the group of standoff members can withstand one or more forces exerted upon the cold plate 180, thus restricting the movement of the cold plate 180 and preventing mechanical contact between the cold plate 180 and one or more of the semiconductor dies 120$_1$-120$_3$, for example.

As illustrated in FIG. 1, at least the first standoff member 190a and the second standoff member 190b can be positioned on respective portions of a surface of the frame layer 140. In some aspects, a gap between the cold plate 180 and the first substrate layer 135 and/or another gap between the cold plate 180 and a member of the group of standoff members including the first standoff member 190a and the second standoff member 190b can be configured to ensure satisfactory (e.g., optimum, nearly optimum, or bound to a criterion) thermal properties of the TIM layer 186 for a specific bond line thickness (BLT) in one or more of the multiple semiconductor dies included in the semiconductor package 110. Thus, in some embodiments, at least the first standoff member 190a and the second standoff member 190b can be configured (e.g., arranged, fabricated, mounted, and/or coupled) to maintain the cold plate 180 at a position and/or orientation that satisfies a defined clearance criterion for the semiconductor package 110. In addition, a height of each (or, in some embodiments, at least one) standoff member of the group of standoff members can be configured to restrict the movement of the cold plate 180, and to permit or otherwise facilitate a satisfactory (e.g., optimal, nearly optimal, or bound to a criterion) thermal coupling between the cold plate 180 and a semiconductor die in the semiconductor package 110 via the TIM layer 186.

In some embodiments, a configuration of the group of standoff members in the semiconductor package 110 can be formed during a fabrication process of the frame layer 140. Therefore, in some embodiments, formation of one or more of the group of standoff members can rely on standard processing stages and/or techniques (e.g., material deposition, etching, or the like), utilized in the processing of the frame layer 140 or other types of stiffener layers. In other embodiments, another configuration of the group of standoff members can be assembled by mounting or otherwise coupling the group of standoff members to an exposed surface of the frame layer 140 and/or a surface the first substrate layer 135. In some implementations, pick-and-place techniques can be utilized or otherwise leveraged to position—individually or collectively—at least a subset of the group of standoff members onto the exposed surface and/or the surface of the first substrate layer 135. Therefore, in some embodiments, at least a first one of the group of support members that includes the first standoff member 190a and the second standoff member 190b can be formed as part of the frame layer 140. In addition or in other embodiments, at least a second one of such group support members can be mounted or can be coupled to a respective portion of the surface of the frame layer 140.

In some embodiments, a height of each of the support members can be determined (e.g., optimized) based at least in part on product design; product size; package size; size and/or symmetry of a semiconductor die mounted on the package substrate; arrangement of two or more semiconductor dies mounted on the package substrate; a combination thereof; or other design aspects. In addition or in other embodiments, the height of a support member can be essentially uniform throughout a defined top cross-section of the support member, and can range from about 50 μm to about 2.0 mm (e.g., 50 μm, 60 μm, 70 μm, 80 μm, 90 μm, 100 μm, 200 μm, 300 μm, 400 μm, 500 μm, 600 mm, 700 μm, 800 μm, 900 μm, 1.0 mm, 1.1 mm, 1.2 mm, 1.3 mm, 1.4 mm, 1.5 mm, and 2.0 mm).

Figure 2:
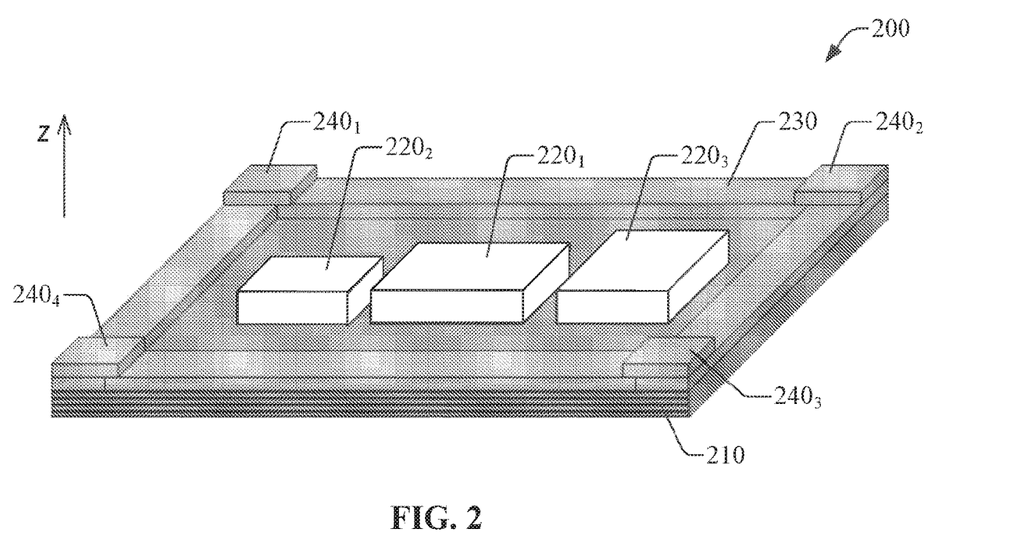
FIG. 2 illustrates an example of a semiconductor package including support members in accordance with one or more embodiments of the disclosure.
Figure 3:
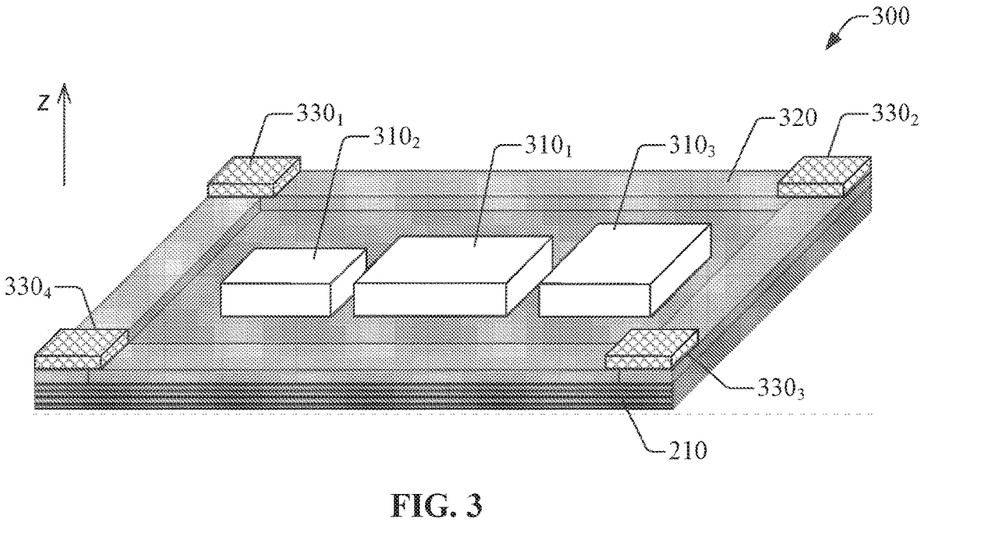
FIG. 3 illustrates another example of a semiconductor package including support members in accordance with one or more embodiments of the disclosure.
Figure 4:
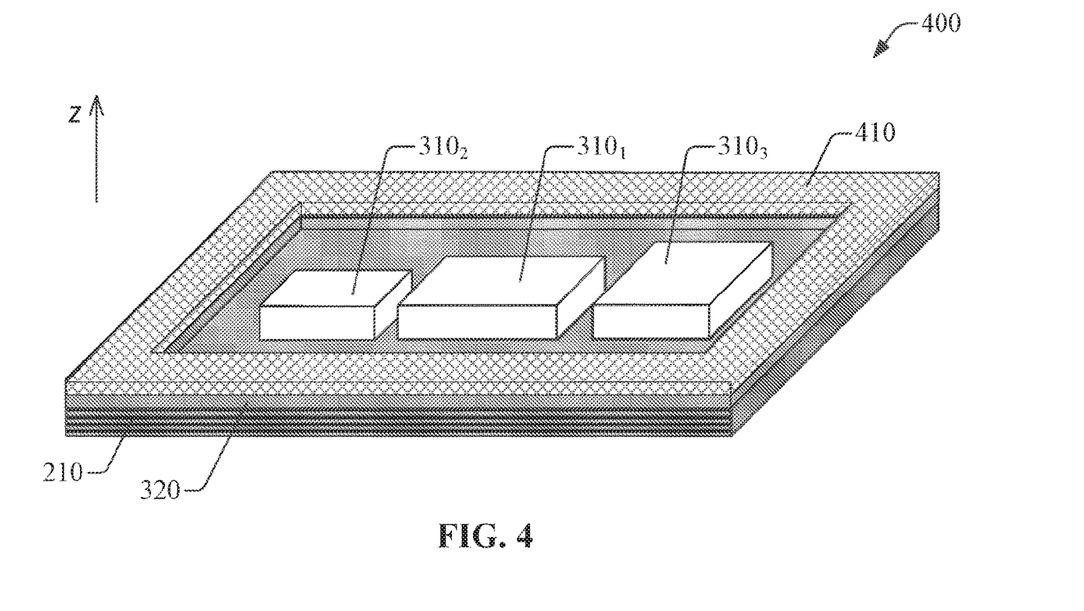
FIG. 4 illustrates yet another example of a semiconductor package including support members in accordance with one or more embodiments of the disclosure.

A group of standoff members in accordance with embodiments of this disclosure can be arranged in numerous configurations within a semiconductor package (such as a bare-die semiconductor package). As an illustration, FIGS. 2-4 illustrate examples of embodiments of a semiconductor package having support members that can prevent physical contact of thermal solution with semiconductor die corner(s) and/or semiconductor die edge(s), or differential scanning calorimetry (DSC) components during an assembly process and manipulation process to integrate the semiconductor package (such as a bare-die package) into a thermal solution. The support members illustrated in each of FIGS. 2-4 can embody or can constitute the at least a subset of the group of standoff members disclosed in connection with FIG. 1. While the package substrate in the illustrated embodiments has essentially $C_4$ point-group symmetry, the disclosure is not limited in that respect and other point-group symmetries can be implemented. In addition, in some embodiments, the package substrate may not have a defined point-group symmetry.

More specifically, FIG. 2 presents an example of a semiconductor package 200 that includes a package substrate 210 and a frame layer 230. Multiple semiconductor dies, including a first die $220_1$, a second die $220_2$, and a third die $220_3$, can be mounted on or otherwise coupled to the package substrate 210. To that end, in one aspect, each of the multiple semiconductor dies can be mounted on or otherwise coupled to a first substrate layer of the package substrate 210. Similar to package substrate 110 or other packages of the disclosure, the package substrate 210 can have multiple substrate layers, including the first substrate layer and a second substrate layer. In some aspects, the second substrate layer can be opposite to the first substrate layer. In addition, in some embodiments, the first substrate layer and the second layer can bound the package substrate 210 at respective sides. As such, in one example, the first layer and the second layer can be respectively referred to as a top layer and a bottom layer along the stacking direction (indicated as a z in FIG. 2) of the multiple substrate layers. It is noted that, in another example, such a characterization can be reversed, with the second substrate layer referred to as the top layer and the first substrate layer referred to as the bottom layer. In embodiments in which the package substrate 210 includes a core layer, the first substrate layer can be adjacent to a first surface of the core layer and the second substrate layer can be adjacent to a second surface of the of the core layer, the second surface opposite to the first surface.

In some embodiments, the frame layer 230 can include a rigid material, and can serve as a stiffener for the semiconductor package 200, mitigating or otherwise avoiding warpage of the package substrate 210. To that end, in some embodiments, the rigid material can include, for example, a semiconductor, a metal, a metallic alloy, a ceramic material, a hard polymer, a combination thereof, or the like. In addition, in one aspect, elastic constants of the rigid material can have respective magnitudes that can be greater than the magnitudes of corresponding elastic constants of a material that constitutes the package substrate 210. For instance, the Young modulus of the rigid material can be greater than the other Young modulus of the material that constitutes the package substrate 210. Further or in other aspects, the frame layer 230 can form an interface with the package substrate 210. Specifically, in one embodiment, the interface can be formed with the first substrate layer having mounted thereon or being coupled to the semiconductor dies $220_1$-$220_3$. As mentioned, in such an embodiment, the first substrate layer is included within multiple substrate layers that can constitute the package substrate 210, and embodies an outermost layer (such as a top layer) of the package substrate 210. The frame layer 230 also can include a substantially planar surface opposite to the interface, where the substantially planar surface defines an inner perimeter and an outer perimeter. The outer perimeter can be registered or otherwise aligned with a perimeter of a surface of the first substrate layer. The surface of the first substrate layer can be substantially perpendicular to the stacking direction and can include multiple edges (or sides) that define the perimeter. As illustrated, the outer perimeter and the perimeter can have a rectangular shape.

As illustrated in FIG. 2, the frame 230 can include a group of support members, including a first support member $240_1$, a second support member $240_2$, a third support member $240_3$, and a fourth support member $240_4$. In some aspects, the group of support members can be integrated into the frame 230—e.g., the frame 230 and the group of support members form a single part that can be coupled to the package substrate 210. While four support members are illustrated, the disclosure is not so limited and, in some embodiments, more than four support members or less than four support members can be contemplated. The first support member $240_1$, the second support member $240_2$, the third support member $240_3$, and the fourth support member $240_4$ can be positioned or otherwise arranged adjacent to a respective one of the four corners of the outer perimeter defined by the frame 230. In addition, each of the first support member $240_1$, the second support member $240_2$, the third support member $240_3$, and the fourth support member $240_4$ has a substantially rectangular parallelepiped shape having of a defined thickness along the stacking direction. In one aspect, the defined thickness can be similar to a thickness of a thickest of the multiple semiconductor dies included in the semiconductor package 210. For instance, the defined thickness can be greater than the other thickness by a defined percentage (e.g., 1%, 2%, 3%, 4%, or 5%). The substantially rectangular parallelepiped shape has a square cross-sectional area on a plane perpendicular to the stacking direction.

In some embodiments, a support member of the group of support members in the frame 230 can be embodied in a protrusion of a defined shape—e.g., a dome, a hemisphere, a hemi-ellipsoid, a rod, a whisker, a column, and the like. As mentioned, the defined shape can be determined based at least on a design of a semiconductor die included in the semiconductor package 210 and/or an arrangement of two or more of the multiple semiconductor dies that can be included in the semiconductor package 210. As such, a shape of the support member is not limited to a substantially rectangular parallelepiped shape. In some embodiments, the support member can form a U-shaped structure that can span a first edge of the frame 230 and respective portions of a second edge and a third edge of the frame layer 230. In other embodiments, the support member can form an L-shaped structure spanning respective portions of a first edge and a second edge of the frame 230. A combination of support members of different shapes also is contemplated. In addition, a position of the support member within the frame 230 is not limited to a corner of the outer perimeter defined by the frame 230. In some embodiments, the support member can be positioned at a location adjacent to an edge of the outer perimeter.

Mitigation of potential damage of a semiconductor die within a semiconductor package also can be accomplished by mounting or otherwise coupling one or more support members to a stiffener or another type of frame layer included in the semiconductor package. Thus, in some embodiments, rather than fabricating the stiffener to include the support member(s), the stiffener can be embodied in or can include a substantially flat frame layer and the support member(s) can be mounted or otherwise coupled to the substantially flat frame layer at defined location(s) within such a layer. FIGS. 3-4 illustrate examples of semiconductor packages having support members that can be mounted or otherwise coupled to a frame layer, in accordance with one or more embodiments of the disclosure.

With reference to FIG. 3, a semiconductor package 300 can include multiple semiconductor dies, including a first die $310_1$, a second die $310_2$, and a third die $310_3$, can be mounted on or otherwise coupled to the package substrate 210 in a bare-die configuration. The semiconductor package 300 also includes a frame layer 320 mounted or otherwise coupled to the package substrate 210. Similar to the frame layer 230 illustrated in FIG. 2, the frame layer 320 can form an interface with a first substrate layer (e.g., an outermost substrate layer) of multiple substrate layer that constitute the package substrate 210. The frame layer 230 can include a substantially planar top surface that is perpendicular to the stacking direction z and opposite to the interface formed between the frame layer 230 and the package substrate 210. To the end, in some embodiments, the frame layer 230 can be formed on the first substrate layer. The frame layer 230 can be accomplished by one or a combination of numerous deposition processes that permit depositing an amount of a material (e.g., a metal, a metal alloy, a semiconductor, a ceramic, or the like). The deposition processes can include, for example, chemical vapor deposition (CVD); atomic layer deposition (ALD); physical vapor deposition (PVD); sputtering; chemical solution deposition; plating (autocatalytic plating, immersion plating, electrolytic plating, or a combination thereof); or the like. Chemical vapor deposition can include, for example, metal organic chemical vapor deposition (MOCVD), low-pressure chemical vapor deposition (LPCVD), or plasma enhanced chemical vapor deposition (PECVD). In other embodiments, the frame layer 320 can be mounted or otherwise coupled to the first substrate layer.

The semiconductor package 300 can include a group of support members, including a first support member $330_1$, a second support member $330_2$, a third support member $330_3$, and a fourth support member $330_4$. While four support members are illustrated, the disclosure is not so limited and, in some embodiments, more than four support members or less than four support members can be contemplated. Each of the first support member $330_1$, the second support member $330_2$, the third support member $330_3$, and the fourth support member $330_4$ can be mounted or otherwise coupled to the substantially planar top surface of the frame layer 320. In some implementations, pick-and-place equipment can be utilized or otherwise leveraged to position—individually or collectively—the first support member $330_1$, the second support member $330_2$, the third support member $330_3$, or the fourth support member $330_4$ at respective locations in the frame layer 320.

Specifically, in one example, the first support member $330_1$, the second support member $330_2$, the third support member $330_3$, and the fourth support member $330_4$ can be positioned or otherwise arranged adjacent to a respective one of the four corners of the outer perimeter defined by the frame layer 320. In addition, as illustrated, each of the first support member $330_1$, the second support member $330_2$, the third support member $330_3$, and the fourth support member $330_4$ has a substantially rectangular parallelepiped shape having of a defined thickness along the stacking direction. As mentioned, in one aspect, the defined thickness can be similar to a thickness of a thickest of the multiple semiconductor dies included in the semiconductor package 300. For instance, the defined thickness can be greater than the thickness of the thickest semiconductor die by a defined percentage (e.g., 1%, 2%, 3%, 4%, 5%, or the like). The substantially rectangular parallelepiped shape has a square cross-sectional area on a plane perpendicular to the stacking direction. As disclosed herein, in some embodiments, a support member of the group of support members included in the semiconductor package 300 can form a U-shaped structure that can span a first edge of the frame 320 and respective portions of a second edge and a third edge of the frame layer 320. In addition or in other embodiments, the support member can form an L-shaped structure spanning respective portions of a first edge and a second edge of the frame 320. As mentioned, a combination of support members of different shapes also is contemplated.

In one embodiment, at least a first one of the first support member $330_1$, the second support member $330_2$, the third support member $330_3$, and the fourth support member $330_4$ can be formed from or can include a first rigid material or a first flexible material. In addition or in another embodiment, at least a second one of the first support member $330_1$, the second support member $330_2$, the third support member $330_3$, and the fourth support member $330_4$ can be formed from or can include a second rigid material or a second flexible material. The first rigid material and the second rigid material can include, in one example, a metal; a metal alloy; an alloy of a metal and a non-metal; a ceramic material; a hard polymer; a porous material having semiconductor matrix having multiple air gaps (or pores) or a hard polymer matrix having multiple air gaps; a combination thereof; or the like. The first flexible material and the second flexible material can include, in one example, another porous material including a soft polymer matrix having multiple air gaps; or a soft polymer. In another example, the flexible material can include an adhesive plastic film (e.g., a polyethylene terephthalate (PET) film or a polyimide film) or another type of tape.

In some embodiments, a support member of the group of support members in the frame 320 can be embodied in a protrusion of a defined shape—e.g., a dome, a hemisphere, a hemi-ellipsoid, a rod, a whisker, a column, and the like. As mentioned, the defined shape can be determined based at least on a design of a semiconductor die included in the semiconductor package 300 and/or an arrangement of two or more of the multiple semiconductor dies that can be included in the semiconductor package 300. As such, a shape of the support member is not limited to a substantially rectangular parallelepiped shape. In addition, a position of the support member within the frame 320 is not limited to a corner of the outer perimeter defined by the frame 320. In some embodiments, the support member can be positioned at a location adjacent to an edge of the outer perimeter.

As mentioned, in some embodiments, rather than including multiple support members, a semiconductor package can include a single support member to mitigate potential damage of a semiconductor die within a semiconductor package. As such, in one of such embodiment, the single support member mounted or otherwise coupled to a stiffener included in the semiconductor package in a manner that the single support member is registered or otherwise aligned with the stiffener. As an illustration, FIG. 4 presents an example of a semiconductor package 400 including the package substrate 210, the frame layer 320, and multiple semiconductor dies, including semiconductor dies $310_1$-$310_3$. The semiconductor package 400 also includes the support member 410 that is embodied, as an example, in a substantially flat layer having a defined thickness. The support member 410 can be formed from or can include a rigid material or a flexible material. The rigid material can include, in one embodiment, a porous material having a soft polymer matrix having multiple air gaps (or pores). The flexible material can include, in one embodiment, another porous material including a soft polymer matrix having multiple air gaps. In another example, the flexible material can include an adhesive plastic film (e.g., a polyethylene terephthalate (PET) film or a polyimide film) or another type of tape.

It is noted that the placement of a support member (e.g., a protrusion or an extended strip) is not limited or otherwise confined to a location of a stiffener or other type of frame layer that can provide rigidity to a semiconductor package. In some embodiments, a support member can be formed in or can be mounted to a location in an inner portion of an exposed surface of the package substrate included in the semiconductor package. Further, while semiconductor packages illustrated herein include a stiffener or other type of frame layer that can provide rigidity to a semiconductor package, the disclosure is not limited in that respect. Thus, in semiconductor packages without a stiffener or another type of frame layer, and one or more support members can be placed directly on an outermost surface of a package substrate of the semiconductor package.

Figure 5:
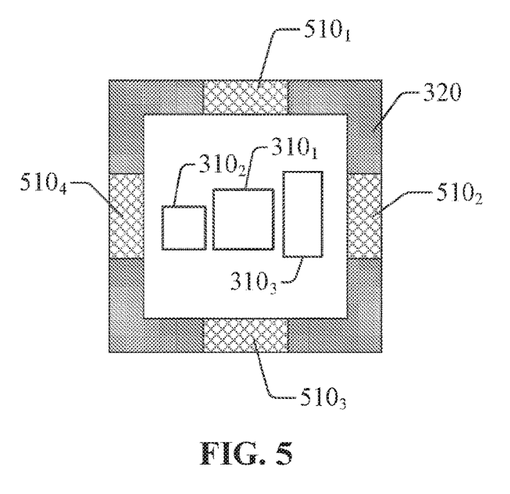
FIGS. 5-8 illustrate schematic top views of examples of an arrangement of support members coupled to a semiconductor package in accordance with one or more embodiments of the disclosure.
Figure 6:
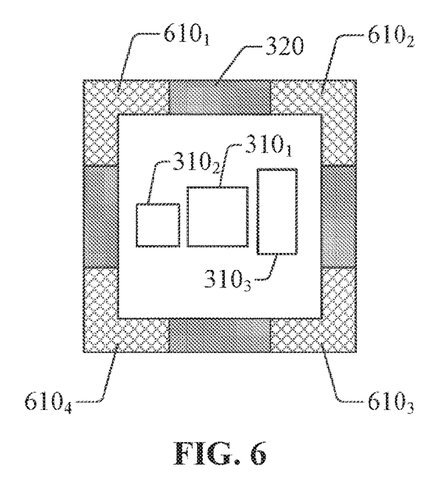

FIGS. 5-8 illustrate examples of an arrangement of support members coupled to a semiconductor package in accordance with one or more embodiments of the disclosure. Similar to other semiconductor packages, the exemplified arrangement of support members includes four support members, a frame layer, and a package substrate can form an assembly that has $C_4$ point-group symmetry. However, the disclosure is not limited in that respect and arrangements and packages with other point-group symmetries can be implemented. In addition, in some embodiments, a semiconductor package including the arrangement of support members may not have a defined point-group symmetry. Further, while the exemplified arrangements illustrate support members formed from a different material than the frame layer, similar arrangements can be implemented in embodiments in which the support members are integrated into rather than attached to the frame layer and formed from the same material. Further yet or in other embodiments, support members integrated into the frame layer (e.g., the frame layer and the support members form a single part) can be formed from a material different from the material that forms the frame layer. In one example, FIG. 5 illustrates a schematic top view of a semiconductor package 500 including the frame layer 320 disclosed herein, and a first support member $510_1$, a second support member $510_2$, a third support member $510_3$, and a fourth support member $510_4$. Each of the support members $510_1$-$510_4$ is positioned at a location adjacent to a respective one of the four sides of the frame layer 320. In addition, each of the support members $510_1$-$510_4$ has a cross-sectional area that extends along a longitudinal axis of a respective side, from a first end to a second end, thus defining a length along the longitudinal axis. In a another example, FIG. 6 illustrates a schematic top view of a semiconductor package 600 including the frame layer 320, and a first support member $610_1$, a second support member $610_2$, a third support member $610_3$, and a fourth support member $610_4$. Each of the support members $610_1$-$610_4$ is L-shaped and is positioned adjacent to a respective one of four corners of the frame layer 320. In addition, each of the support members $610_1$-$610_4$ has a first arm member that extends along a first longitudinal axis of a first side of the frame member 320, and also has a second arm member that extends along a second longitudinal axis of a second side of the frame member 320. The first side and the second side intersect at a corner of the frame member 320.

Figure 7:
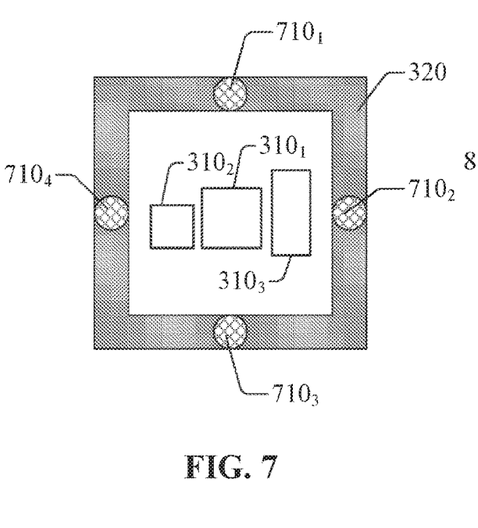
Figure 8:
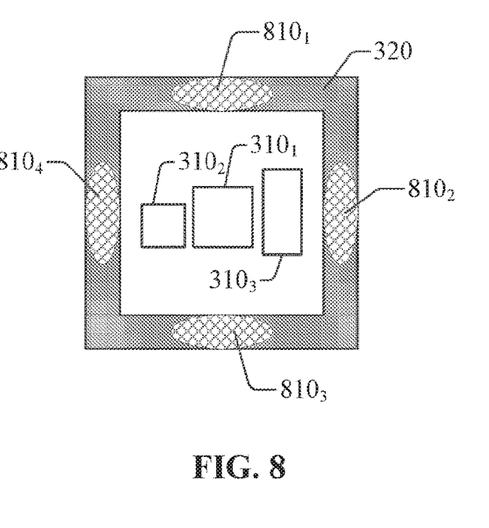

As mentioned, a support member in accordance with embodiments of this disclosure can have one or numerous shapes. In one example, FIG. 7 illustrates a schematic top view of a semiconductor package 700 including the frame layer 320, and a first support member $710_1$, a second support member $710_2$, a third support member $710_3$, and a fourth support member $710_4$. Each of the support members $710_1$-$710_4$ is positioned at a location adjacent to a respective one of the four sides of the frame layer 320. In addition, each of the support members $710_1$-$710_4$ has a cross-sectional area that extends along a longitudinal axis of a respective side, from a first end to a second end, thus defining a length along the longitudinal axis. As illustrated in FIG. 7, the cross-sectional area is circular. In another example, FIG. 8 illustrates a schematic top view of a semiconductor package 800 including the frame layer 320, and a first support member $810_1$, a second support member $810_2$, a third support member $810_3$, and a fourth support member $810_4$. Each of the support members $810_1$-$810_4$ is positioned at a location adjacent to a respective one of the four sides of the frame layer 320. In addition, each of the support members $810_1$-$810_4$ has a cross-sectional area that extends along a longitudinal axis of a respective side, from a first end to a second end, thus defining a length along the longitudinal axis. As illustrated in FIG. 8, the cross-sectional area is ellipsoidal.

Figure 9:
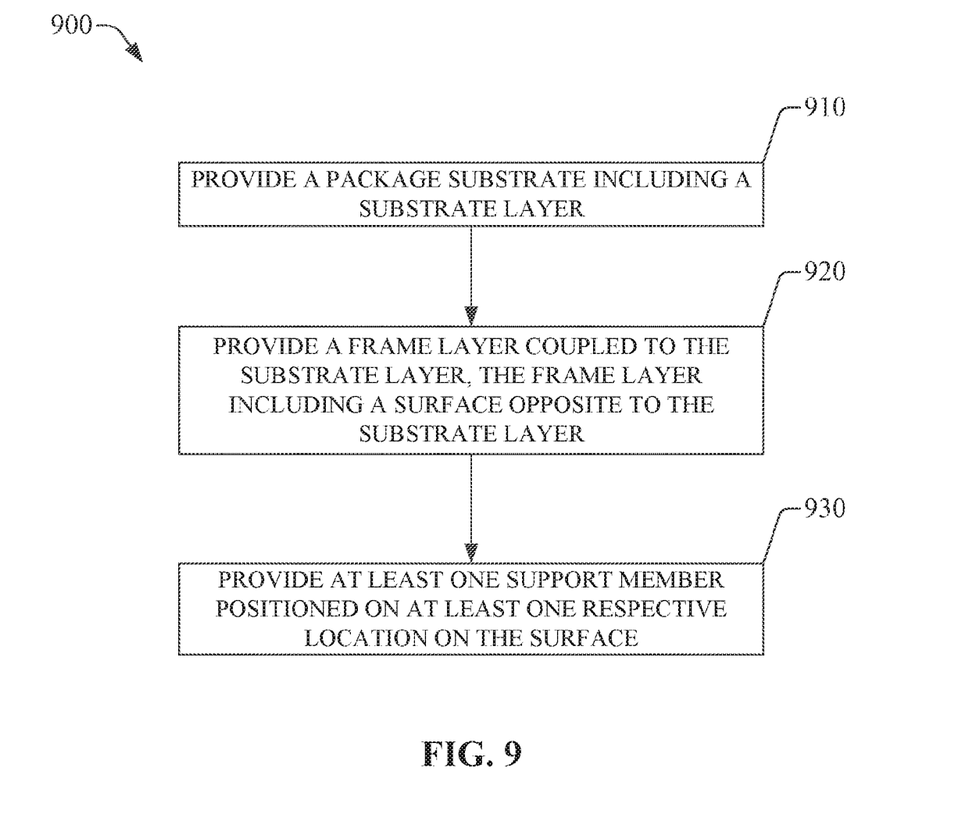
FIG. 9 illustrates an example of a method for support members coupled to a semiconductor packages, according with one or more embodiments of the disclosure.

FIG. 9 illustrates a flowchart of an example of a method 900 for support members coupled to a semiconductor packages, according with one or more embodiments of the disclosure. At block 910, a package substrate including a substrate layer can be provided. The substrate layer can be opposite to another substrate opposite to the first substrate layer. In one aspect, the first substrate layer defines a perimeter. In some embodiments, the package substrate can be included in a semiconductor package including one or more semiconductor dies mounted or otherwise coupled to the substrate layer. At block 920, a frame layer coupled to the substrate layer can be provided. In some embodiments, the frame layer (e.g., a stiffener layer) can include a surface opposite to the substrate layer. The surface can define an inner perimeter and an outer perimeter, wherein the outer perimeter corresponds to or is otherwise registered with the perimeter. At block 930, at least one support member positioned on at least one respective location on the surface can be provided. In some embodiments, a first support member of the at least one support member can be positioned at a first location adjacent to a side of the outer perimeter. The first support member can extend along a direction substantially perpendicular to the surface, from a portion of the surface to a distal end opposite to the portion of the surface. In some embodiments, the first support member can have a substantially uniform thickness along such a direction. Specifically, in one of such embodiments, a distance from the distal end to the portion of the surface can correspond to the substantially uniform thickness.

Figure 10:
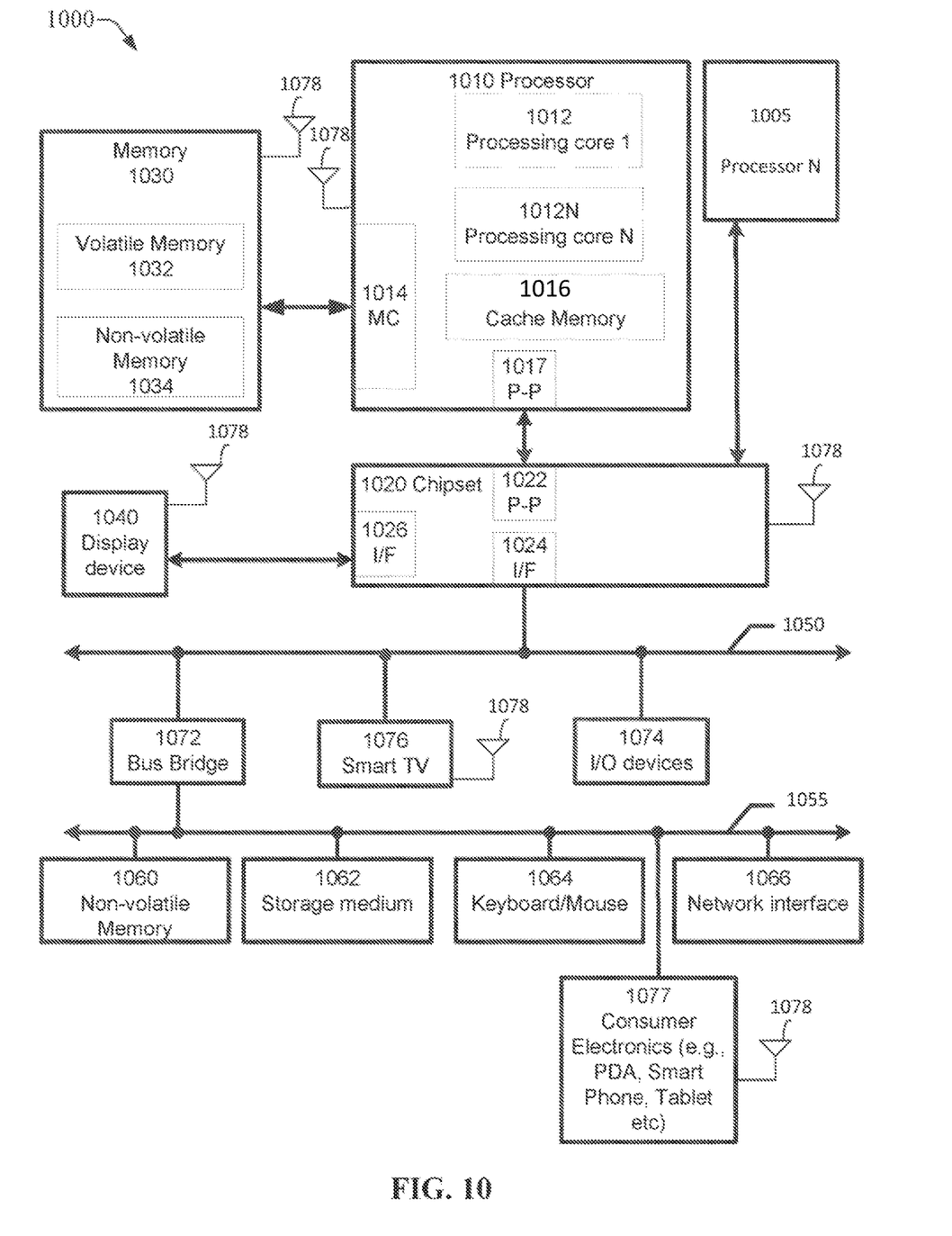
FIG. 10 illustrates an example of a system that utilizes semiconductor package(s) in accordance with one or more embodiments of the disclosure.

FIG. 10 depicts an example of a system 1000 according to one or more embodiments of the disclosure. In one embodiment, system 1000 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1000 can include a system on a chip (SOC) system or a system-in-package (SiP).

In one embodiment, system 1000 includes multiple processors including processor 1010 and processor N 1005, where processor 1005 has logic similar or identical to the logic of processor 1010. In one embodiment, processor 1010 has one or more processing cores (represented here by processing core 1012 and processing core 1012N, where 1012N represents the Nth processor core inside processor 1010, where N is a positive integer). More processing cores can be present (but not depicted in the diagram of FIG. 10). In some embodiments, processing core 1012 includes, but is not limited to, pre-fetch logic to fetch instructions, decode logic to decode the instructions, execution logic to execute instructions, a combination thereof, or the like. In some embodiments, processor 1010 has a cache memory 1016 to cache instructions and/or data for system 1000. Cache memory 1016 may be organized into a hierarchical structure including one or more levels of cache memory.

In some embodiments, processor 1010 includes a memory controller (MC) 1014, which is configured to perform functions that enable the processor 1010 to access and communicate with memory 1030 that includes a volatile memory 1032 and/or a non-volatile memory 1034. In some embodiments, processor 1010 can be coupled with memory 1030 and chipset 1020. Processor 1010 may also be coupled to a wireless antenna 1078 to communicate with any device configured to transmit and/or receive wireless signals. In one embodiment, the wireless antenna interface 1078 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1032 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1034 includes, but is not limited to, flash memory, phase change memory (PCM), read-only memory (ROM), electrically erasable programmable read-only memory (EEPROM), or any other type of non-volatile memory device.

Memory device 1030 stores information and instructions to be executed by processor 1010. In one embodiment, memory 1030 may also store temporary variables or other intermediate information while processor 1010 is executing instructions. In the illustrated embodiment, chipset 1020 connects with processor 1010 via Point-to-Point (PtP or P-P) interface 1017 and P-P interface 1022. Chipset 1020 enables processor 1010 to connect to other elements in system 900. In some embodiments of the disclosure, P-P interface 1017 and P-P interface 1022 can operate in accordance with a PtP communication protocol, such as the Intel® QuickPath Interconnect (QPI) or the like. In other embodiments, a different interconnect may be used.

In some embodiments, chipset 1020 can be configured to communicate with processor 1010, 1005N, display device 1040, and other devices 1072, 1076, 1074, 1060, 1062, 1064, 1066, 1077, etc. Chipset 1020 may also be coupled to the wireless antenna 1078 to communicate with any device configured to transmit and/or receive wireless signals.

Chipset 1020 connects to display device 1040 via interface 1026. Display 1040 may be, for example, a liquid crystal display (LCD), a plasma display, cathode ray tube (CRT) display, or any other form of visual display device. In some embodiments of the disclosure, processor 1010 and chipset 1020 are integrated into a single SOC. In addition, chipset 1020 connects to bus 1050 and/or bus 1055 that interconnect various elements 1074, 1060, 1062, 1064, and 1066. Bus 1050 and bus 1055 may be interconnected via a bus bridge 1072. In one embodiment, chipset 1020 couples with a non-volatile memory 1060, a mass storage device(s) 1062, a keyboard/mouse 1064, and a network interface 1066 via interface 1024 and/or 1004, smart TV 1076, consumer electronics 1077, etc.

In one embodiment, mass storage device(s) 1062 can include, but not be limited to, a solid state drive, a hard disk drive, a universal serial bus flash memory drive, or any other form of computer data storage medium. In one embodiment, network interface 1066 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 10 are depicted as separate blocks within the system 900, the functions performed by some of these blocks may be integrated within a single semiconductor circuit or may be implemented using two or more separate integrated circuits. For example, although cache memory 1016 is depicted as a separate block within processor 1010, cache memory 1016 or selected elements thereof can be incorporated into processor core 1012.

It is noted that the system 1000 described herein may be any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor packages (for example, the semiconductor packages described in connection with any of FIGS. 1-4), as disclosed herein, may be provided in any variety of electronic devices including consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the semiconductor package is provided may be a computing device. Such a computing device may house one or more boards on which the semiconductor package connections may be disposed. The board may include a number of components including, but not limited to, a processor and/or at least one communication chip. The processor may be physically and electrically connected to the board through, for example, electrical connections of the semiconductor package. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

FURTHER EXAMPLES

The following examples pertain to further or alternative embodiments of this disclosure. Example 1 is a semiconductor package, comprising: a substrate layer including a first surface that defines a perimeter; a frame layer forming a first interface with the substrate layer at the surface and including a second surface opposite to the first surface, the second surface defines an inner perimeter and an outer perimeter, the outer perimeter corresponds to the perimeter; and a support member forming a second interface with the frame layer at the second surface and extending in a direction perpendicular to the substrate layer from the second interface to a distal end opposite to the second interface, the support member further extends from a first location in a first edge of the outer perimeter to a second location in a first edge of the inner perimeter and further extends from the first location in the first edge to a third location in the first edge, wherein the first edge of the outer perimeter is adjacent to the first edge of the inner perimeter, the support member to withstand a force oriented along the direction perpendicular to the substrate layer. In example 2, the package of example 1 can optionally include a distance from the second interface to the distal end opposite to the second interface having a magnitude in a range from about 50 µm to about 2.0 mm. In example 3, the package of any one of examples 1-2 can optionally include the support member further extending from the third location in the first edge to a fourth location in a second edge of the outer perimeter, and the support member further extending from the fourth location in the second edge of the outer perimeter to the first location in the outer perimeter. In example 4, the package of any one of examples 1-3 can optionally include the support member comprising a second frame layer, and the second interface defining a second inner perimeter and a second outer perimeter. In example 5, the package of any one of examples 1-4 can optionally include the frame layer comprising a rigid material and the second frame layer comprising a flexible material, and the rigid material comprising one of a semiconductor, a metal, a metallic alloy, a ceramic material, or a polymer, and further wherein the flexible material comprises one of a second polymer or a porous material. In example 6, the package of any one of examples 1-5 can optionally include a second support member, a third support member, and a fourth support member, the outer perimeter forming a first corner, a second corner, and a third corner, the second support member forming a third interface with the frame layer at the second surface, the third interface including the first corner and the second support member to withstand a second force oriented along the direction perpendicular to the substrate layer, the third support member forming a fourth interface with the frame layer at the second surface, the fourth interface includes the second corner and the third support member to withstand a third force oriented along the direction, the fourth support member forming a fifth interface with the frame layer at the second surface, the fifth interface including the third corner and the fourth support member to withstand a fourth force oriented along the direction perpendicular to the substrate layer. In example 7, the package of any one of examples 1-6 can optionally include the support member comprising one of a rigid material or a flexible material. In example 8, the package of any one of examples 1-7 can optionally include the support member comprising a rigid material including one of a semiconductor, a metal, a metallic alloy, a ceramic material, or a polymer. In example 9, the package of any one of examples 1-8 can optionally include the support member comprising a composite material having one of a polymer matrix or a non-polymer matrix. In example 10, the package of any one of examples 1-9 can optionally include the support member comprising a porous material comprising one of a semiconductor matrix or a polymer matrix. In example 11, the package of any one of examples 1-10 can optionally include the support member adhering to the frame layer to form the second interface, the support member comprising a plastic sheet. In example 12, the package of any one of examples 1-11 can optionally include the support member having a shape of a rectangular parallelepiped, a rod, a dome, a hemi-sphere, or a hemi-ellipsoid.

Example 13 is a method for a semiconductor package, comprising: providing a package substrate having a first substrate layer and a second substrate layer opposite to the first substrate layer, the first substrate layer defines a perimeter; providing a frame layer coupled to the first substrate layer, the frame layer including a surface opposite to the first substrate layer, wherein the surface defines an inner perimeter and an outer perimeter, the outer perimeter corresponds to the perimeter; and providing at least one support member positioned on at least one respective location on the surface, wherein a first support member of the at least one support member is positioned at a first location adjacent a side of the outer perimeter and extends from a portion of the surface along a direction substantially perpendicular to the surface, the first support member having a first substantially uniform thickness along the direction. In example 14, the method of example 13 can optionally include providing the frame layer comprising positioning the frame layer on the first substrate layer using a pick-and-place technique; and bonding the frame layer to a portion of the first substrate layer, the frame layer comprising a rigid material including one of a metal, a semiconductor, a metallic alloy, a ceramic material, a composite material, or a polymer. In example 15, the method of any one of examples 13-14 can optionally include the bonding comprising supplying an amount of heat to the frame layer on the first substrate layer during a defined time interval. In example 16, the method of any one of examples 13-15 can optionally include providing the at least one support member comprising mounting the first support member at the first location, the mounting comprising adhering the first support member to a portion of the surface including the first location, the first support member comprising a flexible material. In example 17, the method of any one of examples 13-16 can optionally include providing the frame layer comprising forming the frame layer from a first rigid material, and providing the at least one support member comprising forming the first support member on the frame layer at the first location.

In example 18, the method of any one of examples 13-17 can optionally include forming the first support member comprising depositing a first amount of the first rigid material or a second amount of a second rigid material at the first location, and the first rigid material comprising one of a first metal, a first semiconductor, a first metallic alloy, a first ceramic material, a first composite material, or a first polymer, and wherein the second rigid material comprises a second metal, a second semiconductor, a second metallic alloy, a second ceramic material, a second composite material, or a second polymer.

Example 19 is an electronic device, comprising: at least one semiconductor die coupled to a package substrate via at least one respective group of interconnects, the package substrate comprising, a substrate layer including a first surface that defines a perimeter; a frame layer forming a first interface with the substrate layer at the surface and including a second surface opposite to the first surface, the second surface defines an inner perimeter and an outer perimeter, the outer perimeter corresponds to the perimeter; and a support member forming a second interface with the frame layer at the second surface and extending in a direction perpendicular to the substrate layer from the second interface to a distal end opposite to the second interface, the support member further extends from a first location in a first edge of the outer perimeter to a second location in a first edge of the inner perimeter and further extends from the first location in the first edge to a third location in the first edge, wherein the first edge of the outer perimeter is adjacent to the first edge of the inner perimeter, the support member to withstand a force oriented along the direction perpendicular to the substrate layer. In example 20, the device of example 19 can optionally include the support member further extending from the third location in the first edge to a fourth location in a second edge of the outer perimeter, and the support member further extending from the fourth location in the second edge of the outer perimeter to the first location in the outer perimeter. In example 21, the device of any one of examples 19-20 can optionally include the support member comprising a second frame layer, and the second interface defining a second inner perimeter and a second outer perimeter. In example 22, the device of any one of examples 19-21 can optionally include the frame layer comprising a rigid material and the second frame layer comprising a flexible material, and the rigid material comprising one of a semiconductor, a metal, a metallic alloy, a ceramic material, or a polymer, and further wherein the flexible material comprises one of a second polymer or a porous material. In example 23, the device of any one of examples 19-22 can optionally include the support member comprising a rigid material including one of a semiconductor, a metal, a metallic alloy, a ceramic material, or a polymer. In example 24, the device of any one of examples 19-23 can optionally include the support member comprising a composite material having one of a polymer matrix or a non-polymer matrix. In example 25, the device of any one of examples 19-24 can optionally include the support member comprising a porous material comprising one of a semiconductor matrix or a polymer matrix.

Example 26 is an electronic system, comprising: a cold plate; a thermal interface material (TIM) layer in thermal contact with the cold plate; at least one semiconductor die in thermal contact with the TIM layer, the at least one semiconductor die coupled to a package substrate via at least one respective group of interconnects, the package substrate comprising, a substrate layer including a first surface that defines a perimeter; a frame layer forming a first interface with the substrate layer at the surface and including a second surface opposite to the first surface, the second surface defines an inner perimeter and an outer perimeter, the outer perimeter corresponds to the perimeter; and a support member forming a second interface with the frame layer at the second surface and extending in a direction perpendicular to the substrate layer from the second interface to a distal end opposite to the second interface, the support member further extends from a first location in a first edge of the outer perimeter to a second location in a first edge of the inner perimeter and further extends from the first location in the first edge to a third location in the first edge, wherein the first edge of the outer perimeter is adjacent to the first edge of the inner perimeter, the support member to withstand a force oriented along the direction perpendicular to the substrate layer, the force exerted by the cold plate. In example 27, the system of example 26 can optionally include the support member further extending from the third location in the first edge to a fourth location in a second edge of the outer perimeter, and the support member further extending from the fourth location in the second edge of the outer perimeter to the first location in the outer perimeter. In example 28, the system of any one of examples 26-27 can optionally include the support member comprising a second frame layer, and wherein the second interface defining a second inner perimeter and a second outer perimeter. In example 29, the system of any one of examples 26-28 can optionally include the frame layer comprising a rigid material and the second frame layer comprising a flexible material, and the rigid material comprising one of a semiconductor, a metal, a metallic alloy, a ceramic material, or a polymer, and further wherein the flexible material comprises one of a second polymer or a porous material. In example 30, the system of any one of examples 26-29 can optionally include the support member comprising a rigid material including one of a semiconductor, a metal, a metallic alloy, a ceramic material, or a polymer. In example 31, the system of any one of examples 26-30 can optionally include the support member comprising a composite material having one of a polymer matrix or a non-polymer matrix. In example 32, the system of any one of examples 26-31 can optionally include the support member comprising a porous material comprising one of a semiconductor matrix or a polymer matrix.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of semiconductor packages including support members that can mitigate damage of semiconductor die(s) during manipulation of a system (e.g., a thermal solution) included in the semiconductor package(s) in conjunction with the semiconductor die(s). Techniques to provide such packages also are provided. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. A semiconductor package, comprising:
   a substrate layer including a first surface that defines a perimeter, wherein the substrate layer forms an interface with a board substrate through one or more interconnects;
   a frame layer forming a first interface with the substrate layer at the first surface and including a second surface opposite to the first surface, the second surface defines an inner perimeter and an outer perimeter, the outer perimeter corresponds to the perimeter;
   a first support member and a second support member, the first support member being coupled to a first flexible plate and the board substrate, the second support member being coupled to a second flexible plate and the board substrate, the first flexible plate and second flexible plate being coupled to a cold plate;
   a standoff member forming a second interface with the frame layer at the second surface and extending in a direction perpendicular to the substrate layer from the second interface to a distal end opposite to the second interface, the standoff member further extends from a first location in a first edge of the outer perimeter to a second location in a first edge of the inner perimeter and further extends from the first location in the first edge of the outer perimeter to a third location in the first edge, wherein the first edge of the outer perimeter is adjacent to the first edge of the inner perimeter, the standoff member to withstand a force oriented along the direction perpendicular to the substrate layer and produced by the coupling between the first support member, first flexible plate, and the cold plate and the coupling between the second support member, second flexible plate, and the cold plate; and
   a semiconductor die mounted to the substrate layer through an interconnect coupled to a third surface of the semiconductor die, wherein the semiconductor die comprises a fourth surface opposite to the third surface, and wherein the distal end of the standoff member extends to a first height above a second height associated with the fourth surface, and further wherein a cross section of the member is circular or ellipsoidal.

2. The semiconductor package of claim 1, wherein a distance from the second interface to the distal end opposite to the second interface has a magnitude in a range from about 50 μm to about 2.0 mm.

3. The semiconductor package of claim 1, wherein the standoff member further extends from the third location in the first edge to a fourth location in a second edge of the outer perimeter, and wherein the standoff member further extends from the fourth location in the second edge of the outer perimeter to the first location in the outer perimeter.

4. The semiconductor package of claim 1, wherein the standoff member comprises a second frame layer, and wherein the second interface defines a second inner perimeter and a second outer perimeter.

5. The semiconductor package of claim 4, wherein the frame layer comprises a rigid material and the second frame layer comprises a flexible material, and wherein the rigid material comprises one of a semiconductor, a metal, a metallic alloy, a ceramic material, or a polymer, and further wherein the flexible material comprises one of a second polymer or a porous material.

6. The semiconductor package of claim 1, further comprising a second standoff member, a third standoff member, and a fourth standoff member, wherein the outer perimeter forms a first corner, a second corner, and a third corner,
   wherein the second standoff member forms a third interface with the frame layer at the second surface, the third interface includes the first corner and the second standoff member to withstand a second force oriented along a direction perpendicular to the substrate layer,
   wherein the third standoff member forms a fourth interface with the frame layer at the second surface, the fourth interface includes the second corner and the third standoff member to withstand a third force oriented along the direction,
   wherein the fourth standoff member forms a fifth interface with the frame layer at the second surface, the fifth interface includes the third corner and the fourth standoff member to withstand a fourth force oriented along the direction perpendicular to the substrate layer.

7. The semiconductor package of claim 1, wherein the standoff member comprises one of a sponge or foam material.

8. The semiconductor package of claim 1, wherein the standoff member comprises a rigid material including one of a semiconductor, a metal, a metallic alloy, a ceramic material, or a polymer.

9. The semiconductor package of claim 1, wherein the standoff member comprises a composite material having one of a polymer matrix or a non-polymer matrix.

10. The semiconductor package of claim 1, wherein the standoff member comprises a porous material comprising one of a semiconductor matrix or a polymer matrix.

11. The semiconductor package of claim 1, wherein the standoff member adheres to the frame layer to form the second interface, the standoff member comprising a plastic sheet.

12. The semiconductor package of claim 1, wherein the standoff member has a shape of a rectangular parallelepiped, a rod, a dome, a hemi-sphere, or a hemi-ellipsoid.

13. The semiconductor package of claim 1, wherein the first height of the standoff member is configured to prevent a contact between a thermal solution disposed on the semiconductor die and a corner or edge of the semiconductor die.

14. A method for making a semiconductor package, comprising:
providing a package substrate having a first substrate layer and a second substrate layer opposite to the first substrate layer, the first substrate layer defines a perimeter, wherein the substrate layer is configured to form an interface with a board substrate;
providing a frame layer coupled to the first substrate layer, the frame layer including a surface opposite to the first substrate layer, wherein the surface defines an inner perimeter and an outer perimeter, the outer perimeter corresponds to the perimeter;
providing a first support member and a second support member, the first support member being coupled to a first flexible plate and the board substrate, the second support member being coupled to a second flexible plate and the board substrate, the first flexible plate and second flexible plate being coupled to a cold plate;
providing at least one standoff member positioned on at least one respective location on the surface, wherein a first standoff member of the at least one standoff member is positioned at a first location adjacent to a side of the outer perimeter and extends from a portion of the surface along a direction substantially perpendicular to the surface, the first standoff member having a first substantially uniform thickness along the direction, the standoff member to withstand a force oriented along the direction perpendicular to the substrate layer and produced by the coupling between the first support member, first flexible plate, and the cold plate and the coupling between the second support member, second flexible plate, and the cold plate; and
providing at least one semiconductor die mounted to the substrate layer through an interconnect coupled to a third surface of the semiconductor die, wherein the semiconductor die comprises a fourth surface opposite to the third surface, and wherein a distal end of the standoff member extends to a first height above a second height associated with the fourth surface, and further wherein a cross section of the standoff member is circular or ellipsoidal.

15. The method of claim 14, wherein providing the frame layer comprises positioning the frame layer on the first substrate layer using a pick-and-place technique; and
bonding the frame layer to a portion of the first substrate layer, the frame layer comprising a rigid material including one of a metal, a semiconductor, a metallic alloy, a ceramic material, a composite material, or a polymer.

16. The method of claim 15, wherein the bonding comprises supplying an amount of heat to the frame layer on the first substrate layer during a defined time interval.

17. The method of claim 14, wherein providing the frame layer comprises forming the frame layer from a first rigid material, and wherein providing the at least one standoff member comprises forming the first standoff member on the frame layer at the first location.

18. The method of claim 17, wherein forming the first standoff member comprises depositing a first amount of the first rigid material or a second amount of a second rigid material at the first location, and wherein the first rigid material comprises one of a first metal, a first semiconductor, a first metallic alloy, a first ceramic material, a first composite material, or a first polymer, and wherein the second rigid material comprises a second metal, a second semiconductor, a second metallic alloy, a second ceramic material, a second composite material, or a second polymer.

19. The method of claim 14, wherein providing the at least one standoff member comprises mounting the first standoff member at the first location, the mounting comprising adhering the first standoff member to a portion of the surface including the first location, wherein the first standoff member comprises a flexible material.

20. An electronic device, comprising:
at least one semiconductor die coupled to a package substrate via at least one respective group of interconnects, the package substrate comprising,
a substrate layer including a first surface that defines a perimeter;
a frame layer forming a first interface with the substrate layer at the surface and including a second surface opposite to the first surface, the second surface defines an inner perimeter and an outer perimeter, the outer perimeter corresponds to the perimeter;
a first support member and a second support member, the first support member being coupled to a first flexible plate and a board substrate, the second support member being coupled to a second flexible plate and the board substrate, the first flexible plate and second flexible plate being coupled to a cold plate;
a standoff support forming a second interface with the frame layer at the second surface and extending in a direction perpendicular to the substrate layer from the second interface to a distal end opposite to the second interface, the standoff member further extends from a first location in a first edge of the outer perimeter to a second location in a first edge of the inner perimeter and further extends from the first location in the first edge to a third location in the first edge, wherein the first edge of the outer perimeter is adjacent to the first edge of the inner perimeter, the standoff member to withstand a force oriented along the direction perpendicular to the substrate layer and produced by the coupling between the first support member, first flexible plate, and the cold plate and the coupling between the second support member, second flexible plate, and the cold plate; and a semiconductor die mounted to the substrate layer through an interconnect coupled to a third surface of the semiconductor die, wherein the semiconductor die comprises a fourth surface opposite to the third surface, and wherein the distal end of the standoff member extends to a first height above a second height associated with the fourth surface.

21. The electronic device of claim 20, wherein the standoff member comprises a second frame layer, and wherein the second interface defines a second inner perimeter and a second outer perimeter.

22. The electronic device of claim 21, wherein the frame layer comprises a rigid material and the second frame layer comprises a flexible material, and wherein the rigid material comprises one of a semiconductor, a metal, a metallic alloy, a ceramic material, or a polymer, and further wherein the flexible material comprises one of a second polymer or a porous material.

23. The electronic device of claim 20, wherein the standoff member comprises a rigid material including one of a semiconductor, a metal, a metallic alloy, a ceramic material, or a polymer.

24. The electronic device of claim 20, wherein the standoff member comprises a composite material or a porous material having one of a polymer matrix, a semiconductor matrix, or a non-polymer matrix.

25. The electronic device of claim 20, wherein the standoff member further extends from the third location in the first edge to a fourth location in a second edge of the outer perimeter, and wherein the standoff member further extends from the fourth location in the second edge of the outer perimeter to the first location in the outer perimeter.

\* \* \* \* \*